United States Patent [19]

Brandolino et al.

[11] Patent Number: 5,115,197
[45] Date of Patent: May 19, 1992

[54] FLUXGATE SENSOR HAVING ADJUSTABLE CORE EXTENDING BEYOND A COIL WINDING AND A GRADIOMETER INCORPORATING A PAIR OF SENSORS

[76] Inventors: Giusseppe Brandolino, 36 Karen Court, Brampton, Ontario, Canada, L6Y 4J1; Fred Maroske, 28 Shieldmark Crescent, Thornhill, Canada, L3T 3T5

[21] Appl. No.: 498,675

[22] Filed: Mar. 26, 1990

[51] Int. Cl.⁵ .................. G01R 33/022; G01R 33/04; G01V 3/40
[52] U.S. Cl. ...................................... 324/245; 324/253
[58] Field of Search ................ 324/244, 253–255, 324/260–262, 245, 246

[56] References Cited

U.S. PATENT DOCUMENTS

| | | | |
|---|---|---|---|
| 2,390,051 | 12/1945 | Barth | 324/253 |
| 2,605,344 | 7/1952 | Brattain et al. | 324/253 |
| 3,445,928 | 5/1969 | Beynon | 324/254 X |
| 4,384,253 | 5/1983 | Förster | 324/245 X |
| 4,439,732 | 3/1984 | Hesterman et al. | 324/253 X |
| 4,591,788 | 5/1986 | Mohri et al. | 324/253 X |
| 4,611,171 | 9/1986 | Woods | 324/253 |
| 4,623,842 | 11/1986 | Bell et al. | 324/253 X |

Primary Examiner—Kenneth A. Wieder
Assistant Examiner—Warren S. Edmonds
Attorney, Agent, or Firm—Rogers, Bereskin & Parr

[57] ABSTRACT

A fluxgate sensor has a coil body defining a bore and an axis. A coil is wound on the coil body around the axis. A ferromagnetic core is located in the bore and extends beyond either end of the coil, to improve the sensitivity of the sensor. The core may be elongate and have a non-circular profile such as a zig zag pattern. In a gradiometer, the core configuration facilitates balancing of two sensors by either radial or axial adjustment of the core.

12 Claims, 3 Drawing Sheets

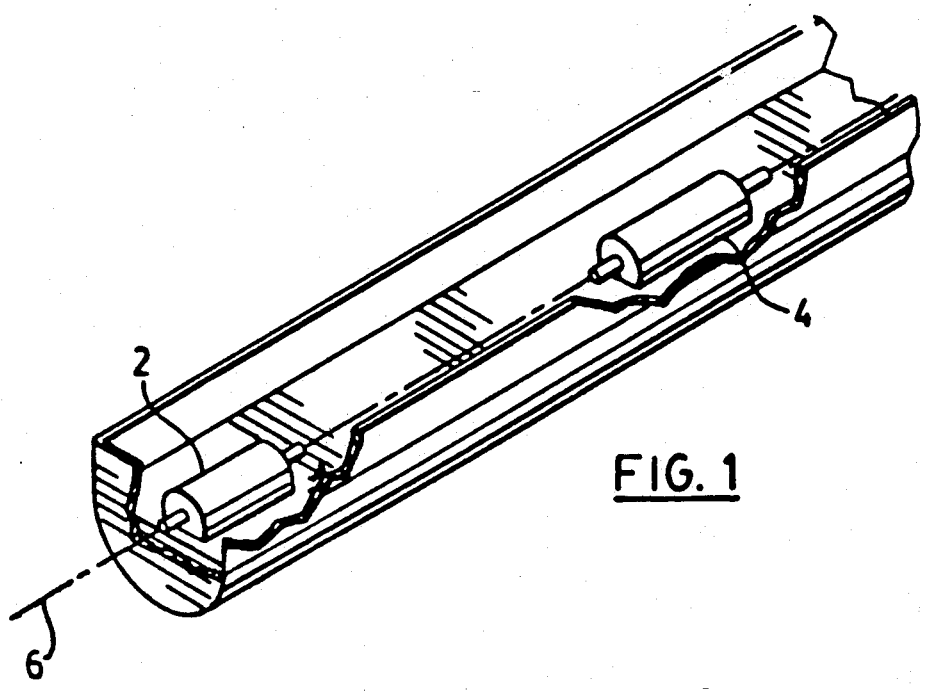
FIG. 1
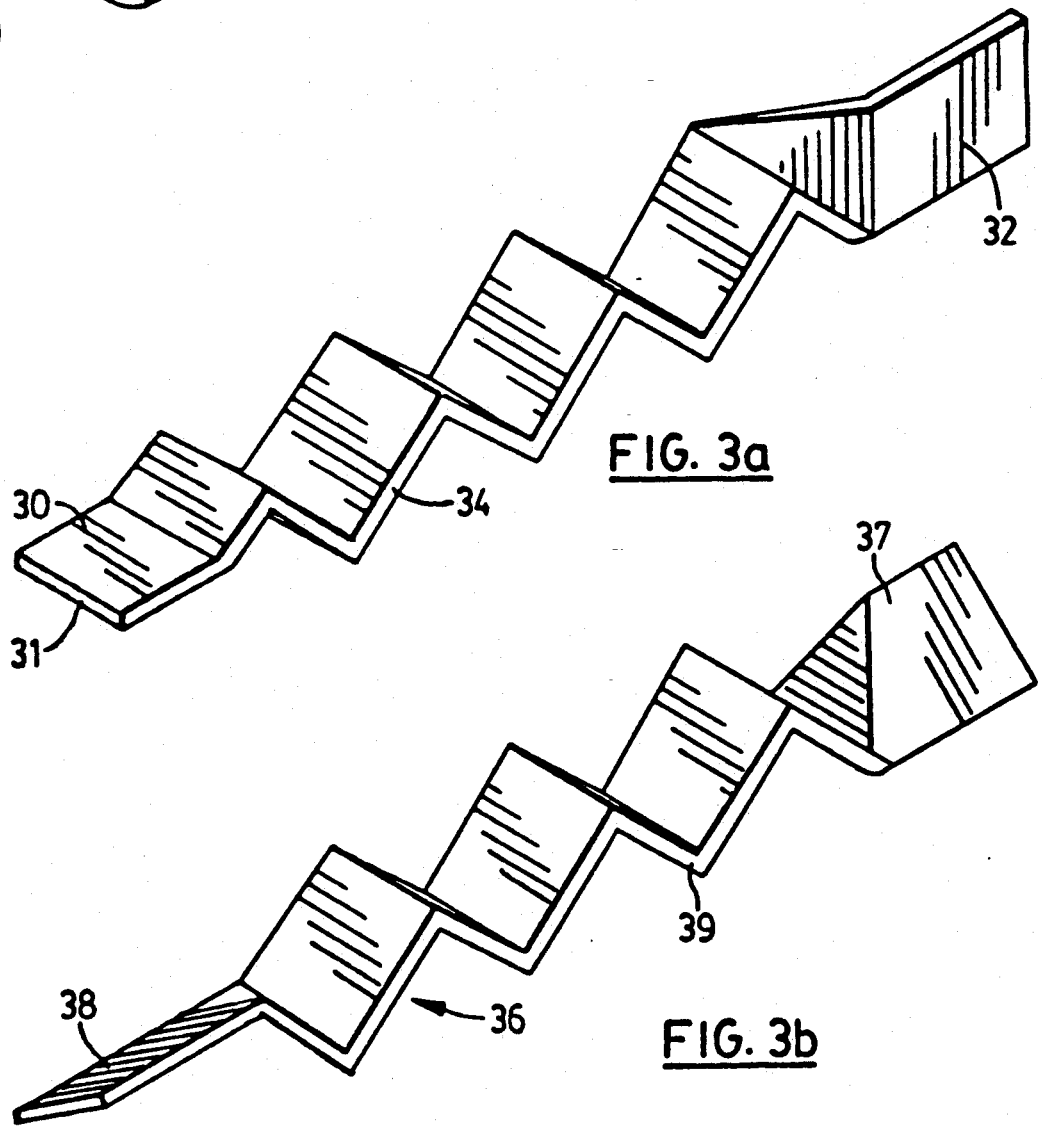
FIG. 3a
FIG. 3b

FLUXGATE SENSOR HAVING ADJUSTABLE CORE EXTENDING BEYOND A COIL WINDING AND A GRADIOMETER INCORPORATING A PAIR OF SENSORS

FIELD OF INVENTION

This invention relates to a fluxgate sensor, and more particularly relates to a parallel fluxgate sensor.

BACKGROUND OF THE INVENTION

Magnetic field sensors can be realized in many forms. A variety of magnetic field sensors have been developed, many of them employing various wound-coil configurations. Other sensors rely on different physical principles. Thus, Hall-effect sensors, Magnetoresistive sensors and Magnetic wire sensors, as well as a version of an electron tube have been used. The present invention is concerned with wound-coil sensors.

A fluxgate sensor is used to detect and measure a magnetic field. Early fluxgate sensors consisted of a length of wire wound on a hollow tubular bobbin with a magnetically sensitive material placed in the centre of the bobbin, to form the core of the sensor. When the sensor is driven into saturation by alternate positive and negative pulses, the response of the sensor coil is a measure of the magnetic field strength parallel to the sensor's axis. Consequently, this type of sensor is referred to as a "parallel fluxgate sensor". Sensors can be configured to provide an "orthogonal fluxgate sensor".

Such sensors are used in a "magnetometer", which is a device that measures the strength of a magnetic field, and a "gradiometer" which is a device that measures the difference in magnetic field strength or gradient of the magnetic field.

There are several practical design considerations when using a sensor of the type just described. Principal considerations are sensitivity and balance. Balance is the most critical design consideration for a gradiometer, since several sensors are used to determine the strength of the magnetic field gradient. Sensitivity is also important, but it is much more easily controlled. If the sensors of a magnetic gradiometer are not exactly balanced, then the gradiometer can give a false output, i.e. it can indicate that there is a difference in the magnetic field when no such difference exists, or alternatively fail to detect if a magnetic difference does occur. Similarly, a device must be sensitive enough for its intended use.

In all known conventional sensors, a sensor has a coil wound about a bobbin and a core located in the bobbin. The core entirely fills the core of the bobbin and does not extend beyond the ends of the core. The core cannot be manipulated, and it is conventional to provide balance and compensation coils to achieve a balance between the sensor coils.

SUMMARY OF THE PRESENT INVENTION

In accordance with the present invention, there is provided a parallel fluxgate sensor, which comprises: a coil body defining a bore with an axis, and a coil wound on the body around the axis; and an adjustable coil of ferromagnetic material located in the bore extending along the axis, wherein the core extends beyond either end of the coil, where the position of the core relative to the coil can be adjusted to balance the sensor relative to another similar sensor.

It has been discovered that, by increasing the length of the core material so that it extends out beyond the ends of the coil, sensitivity of the sensor to a magnetic field is greatly increased. It is believed that this is because the coil's magnetic field pattern lines are more easily perturbed, as compared to a standard fluxgate sensor where the core material does not extend beyond the ends of the coil.

A further advantage of the core shape of the present invention is that in a preferred form described below, it can be used to balance a pair of fluxgate sensors. In a gradiometer, one has two separate sensors, for determining the magnetic field gradient.

Known fluxgate sensors employ multiple windings around the core material. In general, there is a drive winding, a sense winding and a balance winding, which makes for a complex structure. The drive winding is used to saturate the core material in a periodic fashion. The sense winding is used to detect the response of the core material to the excitation by the drive winding and the external magnetic field. The balance winding is used to match the sensor characteristics of the two sensors, to ensure that no incorrect reading is given in the complete gradiometer. If the balance winding was not used, then almost certainly due to usual tolerances etc., the two sensors would detect a difference in magnetic field even where one did not exist.

In a preferred form of the present invention, the core is formed from a non-circular section strip and is mounted in the bore so as to be rotatable about its axis. Then a small twist of the core can be used to adjust each sensor. As well, the cores can be mounted for longitudinal or axial adjustment. Consequently, the sensors according to the present invention do not require balance winding and a minor physical mechanical adjustment of each or one core will enable the two sensors of the device to be matched perfectly.

Additionally, it is possible for the sensor of the present invention to have just a single winding, rather than separate sense and drive windings. When combined with appropriate circuitry, one can still obtain the necessary detection of magnetic fields etc.

BRIEF DESCRIPTION OF THE DRAWINGS

For a better understanding of the present invention and to show more clearly how it may be carried into effect, reference will now be made, by way of example, to the accompanying drawings, in which:

FIG. 1 is a perspective view of a tip of a gradiometer in accordance with the present invention;

FIGS. 3a and 3b are perspective views of the cores of the two sensors of the gradiometer of FIG. 1.

DESCRIPTION OF THE PREFERRED EMBODIMENT

In FIG. 1, there is shown the tip of a gradiometer device, the tip being indicated at 1. The rest of the device can be largely conventional, and hence is not shown in detail. In the tip 1, there are two parallel fluxgate sensors indicated at 2 and 4. The sensors 2, 4 are aligned along a common axis 6.

Figure 2A:
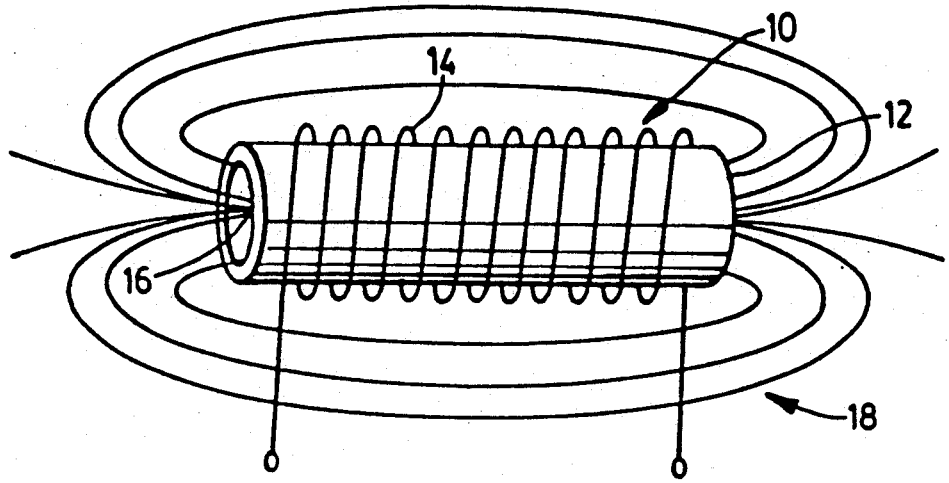
FIGS. 2a and 2b and are perspective views of a conventional fluxgate sensor and a fluxgate sensor in accordance with the present invention showing the magnetic field patterns.
Figure 2B:
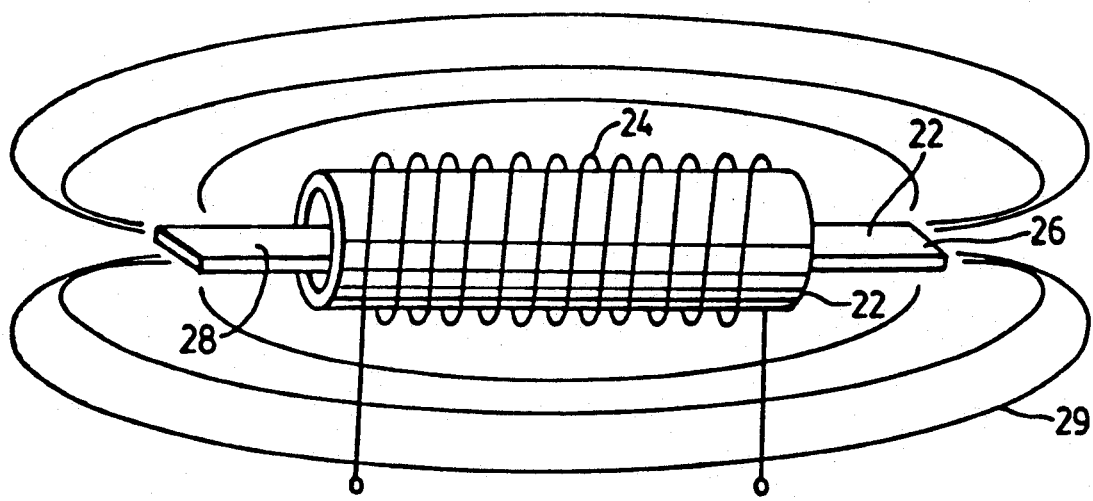

Referring to FIGS. 2a and 2b, FIG. 2a shows a conventional sensor indicated at 10. This sensor 10 includes a coil body 12 which is generally cylindrical, and on which a coil 14 is wound. A core 16, which is in the form of a generally rectangular slab is located within the body 12. It is to be noted that the core 16 does not extend beyond the ends of the coil 14, and indeed is of substantially the same length as the coil 14.

The magnetic field line pattern for this conventional sensor 10 are indicated at 18. It can be seen that the field line pattern is relatively dense at the ends of the core 16 so that it is not overly sensitive to external influences.

FIG. 2b shows one form of a sensor in accordance with the present invention. The sensor 20 again has a coil body 22 and a coil 24 mounted on it. Here, a core 26 is again generally rectangular but the core 26 extends beyond the ends of the coil 24 as indicated by portions 28 outside of the coil 24.

This gives a field pattern 29 as shown. The field pattern is not so concentrated at the ends of the core 26, and hence is more susceptible to influence by an external magnetic field.

Referring to FIGS. 3a and 3b, there are shown two profiles for the sensors 2 and 4 of FIG. 1, respectively.

For the first sensor, sensor 2, a core 30 is formed from a rectangular strip material. The core 30 includes tips 31 and 32 which are at 90 degrees relative to one another. Extending from the tip 31, there are a series of zig zag or V-shaped portions 34.

The core for the sensor 4 is shown in FIG. 3b and indicated at 36. It corresponds closely to the core 30. It has tips 37, 38 which are at right angles to one another and arranged at 45° to an axis of the device 1 and hence at 45° to the tips 31, 32 of the core 30. Again, various zig zag or V-shaped portions 39 are provided between the tips 37, 38.

Whilst the pairs of tips of each core 30 or 36 need not be at 90° to one another, it has been discovered this angle gives the best benefits for balancing. Similarly, the angle of 45° between the tips of the two sensor cores is not essential, but it has been found to be optimum.

The zig-zag profile provides for economic manufacture, whilst providing a core that is uniformly distributed on either side of the axis. The core can be mounted in the coil body and manipulated both axially and radially. An alternative arrangement would be to provide a holder for the core in the form of a tube located within the bore of the coil body, so that the holder and core are manipulated together. Then, the core could be, for example, a flat strip.

In use, the cores are manipulated by twisting each core, or one of the cores, slightly to achieve a balanced condition in certain strategic directions. As well, the cores can be adjusted longitudinally or axially. The cores are then secured in position by adhesive or some mechanical securing means.

Figure 4:
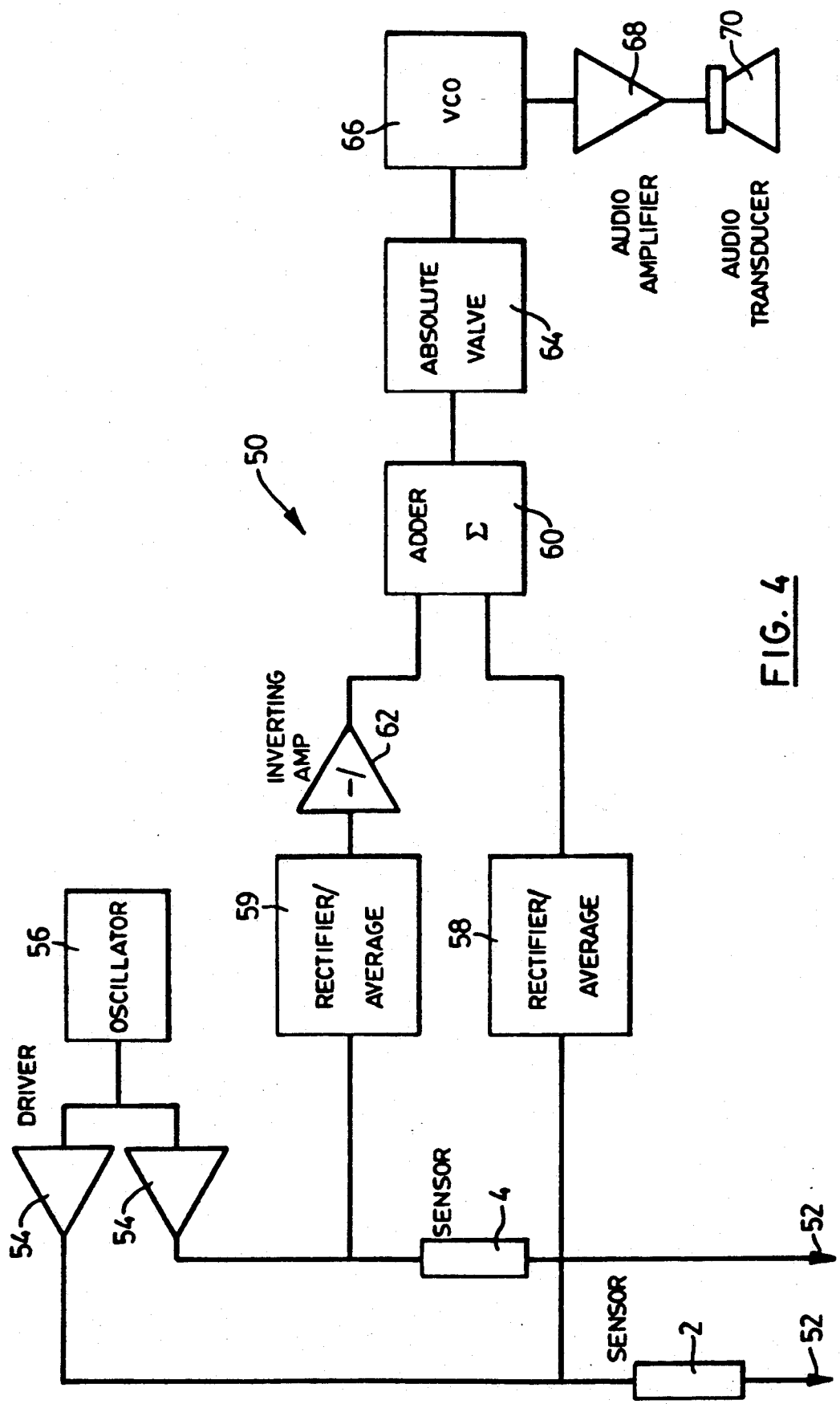
FIG. 4 is a schematic view of a circuit for use with sensors of the present invention.

Reference will now be made to FIG. 4 which shows a schematic block diagram of a circuit, indicated generally at 50, for a gradiometer in accordance with the present invention. One end of each of the coils of the sensors 2, 4 is connected through to ground, as indicated at 52. The other ends of the coils of the sensors 2, 4 serve as inputs and are connected to the outputs of drivers 54, which in turn are driven by an oscillator 56.

The inputs of the sensors are also connected through rectifier and average units 58, 59. The rectifier and average unit 58 for the first sensor 52 is connected directly through to an adder 60. The other unit 59 is connected through an inverting amplifier 62 to the adder 60. Consequently, the adder serves to determine the difference between the signal at the inputs of the two sensors 2, 4. This in turn is related to the difference in the magnetic field sensed by the two sensors which gives a determination of the gradient in the magnetic field.

The output of the adder 60 is connected through an absolute value unit 64 through to a voltage controlled oscillator 66. The voltage controlled oscillator 66 in turn is connected to an audio amplifier 68 which drives an audio transducer 70. Thus, the output of the audio transducer 70 is dependent upon the gradient of the magnetic field sensed by the sensors 2, 4.

Each sensor when coupled to the electronic drive and sense circuitry will have a unique zero offset and gain characteristic. Electrically, the sensor(s) are matched at various 'null' directions to ensure the response from both sensors under all conditions are the same. The electrical nulling does not effect the sensors directly; it adjusts the electronic circuits to compensate for a difference in sensor response.

The electrical balance circuits are standard, and hence are not described here. They compensate for both the sensor differences as well as the circuit component deviations. The mechanical balance provided by the cores compensates for the true mechanical differences between the two sensors. The sensors must be aligned as closely as possible in all three cartesian directions in order to cancel common fields correctly.

A common fluxgate sensor requires that the core be forced into alternate positive and negative saturation. This fact makes a squarewave excitation voltage ideal since saturation will be obtained swiftly and completely. However, several different waveforms have been used including a sinewave, triangle wave and some very complex composite waves. For the present invention, a square wave is suggested, although this is not essential.

When the sensor core reaches saturation, the response of the sensor will include a component from the ambient magnetic field present. The phenomenon is well known, although the fluxgate mechanism is not completely understood.

It has been found that contrary to conventional teaching, it is not essential for the sensor cores to be fully saturated during their operation.

In the present cores 26, there is not complete saturation, particularly at the tips. This behaviour has been established by observing the response of the sensor to the driving waveform. If the sensors were saturated, then the response waveform would not resemble the driving waveform since it would be translated by the non-linear portion of the B-H curve of the sensor. Some saturation does occur, but it is not complete.

The present sensor 20 must be driven close, if not completely, into saturation for proper operation. The circuit 50 exploits the fact that saturation in the entire core is not required for proper fluxgate operation. For an instrument of this class, the sensitivity gained by extending the core exceeds the fact that the entire core is not saturated perfectly and does not provide an ideal response.

It is not presently known if there is an ideal ratio of sensor core length to sensor coil length. It has been found, mainly through experimentation, that extending the core does increase the sensitivity of the sensor when driven and detected in the same manner as the equivalent core with a coil-sized core. For sensors tested, it has been determined that having a core-to-coil ratio of 2:1 is optimum given the drive/sense circuitry, frequency, etc. employed.

It is known to use the drive winding as the sense winding as well. A separate sense winding exists in most sensors to increase sensitivity and optimise coil characteristics. The drive winding can be optimised for saturating the sensor core and requiring a small amount of power to achieve this. The sense winding can be optimised to increase the sensed signal by it's turns ratio with respect to the drive winding, and at the same time, have good impedance characteristics so circuitry interface is simple.

However, it is conventional to provide separate balance and compensating windings. The present invention eliminates the need for a "balance" winding and a "compensating" winding which are commonly used for the matching or balancing of two fluxgate sensors in a gradiometer. Our matching is accomplished mainly through the mechanical matching of the sensors as described above.

We claim:

1. A fluxgate sensor comprising: a coil body defining a bore and an axis; a coil wound on the body around the axis; and an adjustable core formed from an elongate strip of ferromagnetic material, said strip being generally rectangular and of uniform thickness and said core having a generally zig zag profile; wherein said core is located in said bore and said core extends along the bore axis beyond either end of said coil, and wherein the position of said core relative to said coil can be adjusted to balance the sensor relative to another similar sensor.

2. A sensor as claimed in claim 1, wherein the tips of the core are at 90° relative to one another.

3. A sensor as claimed in claim 1, wherein said core is adjustable both axially and radially.

4. A sensor as claimed in claim 1, wherein said core of ferromagnetic material is located in an adjustable holder that fits within the bore of said coil body and extends along said axis beyond either end of the coil.

5. A gradiometer including a pair of spaced apart sensors, each sensor comprising: a coil body defining a bore and an axis; a coil wound on the body around the axis; and an adjustable core formed from an elongate strip of ferromagnetic material, said strip being generally rectangular and of uniform thickness and said core having a generally zig zag profile; wherein said core is located in said bore and said core extends along the bore axis beyond either end of said coil, and wherein the cores of the two sensors are separate and spaced apart from one another.

6. A gradiometer as claimed in claim 5, wherein the tips of each core are at 90° relative to one another.

7. A gradiometer as claimed in claim 6, wherein the tip of one core facing the tips of the other core are at 45° to one another.

8. A gradiometer as claimed in claim 8, which includes an oscillator and a pair of drivers having outputs connected to respective inputs of the coils of the two sensors, the oscillator being connected to inputs of the drivers, and wherein outputs of the two sensors are connected to ground.

9. A gradiometer as claimed in claim 8, which includes a pair of rectifier and averaging units connected to respective inputs of the inputs of the two sensors, and an adder unit connected to outputs of the rectifier and averaging units being connected to the adder unit by an inverting amplifier, whereby the adder produces at an output thereof a signal corresponding to the difference between the responses of the two sensors.

10. A device as claimed in claim 9, which includes: an absolute value unit having an input connected to the output of the adder and an output; a voltage controlled oscillator having an input connected to the output of the absolute value unit and a respective output; and an audio amplifier and an audio transducer connected to the output of the voltage controlled oscillator.

11. A gradiometer as claimed in claim 5, wherein said core is adjustable both axially and radially.

12. A gradiometer as claimed in claim 5, wherein said core of ferromagnetic material is located in an adjustable holder that fits within the bore of said coil body and extends along said axis beyond either end of the coil.

* * * * *